(12) United States Patent
Inoue et al.

(10) Patent No.: US 8,871,890 B2
(45) Date of Patent: Oct. 28, 2014

(54) CURABLE RESIN COMPOSITION AND CURED ARTICLE

(75) Inventors: Keizo Inoue, Himeji (JP); Shigeaki Kamuro, Himeji (JP)

(73) Assignee: Daicel Corporation, Osaka (JP)

( * ) Notice: Subject to any disclaimer, the term of this patent is extended or adjusted under 35 U.S.C. 154(b) by 20 days.

(21) Appl. No.: 13/813,895

(22) PCT Filed: Oct. 31, 2011

(86) PCT No.: PCT/JP2011/075063
§ 371 (c)(1),
(2), (4) Date: Feb. 1, 2013

(87) PCT Pub. No.: WO2012/060322
PCT Pub. Date: May 10, 2012

(65) Prior Publication Data
US 2013/0131265 A1    May 23, 2013

(30) Foreign Application Priority Data
Nov. 4, 2010 (JP) ................................. 2010-247655

(51) Int. Cl.
| | | |
|---|---|---|
| C08G 77/12 | (2006.01) |
| C09K 3/10 | (2006.01) |
| H01L 23/29 | (2006.01) |
| C08L 83/04 | (2006.01) |
| C08G 77/04 | (2006.01) |
| C08G 77/20 | (2006.01) |

(52) U.S. Cl.
CPC .............. *C08G 77/04* (2013.01); *C08G 77/045* (2013.01); *C08G 77/20* (2013.01); *C09K 3/1018* (2013.01); *H01L 23/295* (2013.01); *C08G 77/12* (2013.01); *C08L 83/04* (2013.01)
USPC ............................................. 528/31; 528/32

(58) Field of Classification Search
CPC ......... C08L 83/04; C08L 83/00; C08G 77/12; C08G 77/20
USPC ..................................... 528/31, 32
See application file for complete search history.

(56) References Cited

U.S. PATENT DOCUMENTS

| | | | |
|---|---|---|---|
| 5,739,199 A | 4/1998 | Eguchi et al. |
| 6,815,520 B2 | 11/2004 | Yoneda et al. |
| 7,527,871 B2 | 5/2009 | Morita et al. |
| 7,625,986 B2 | 12/2009 | Yoshitake et al. |
| 2004/0116640 A1 | 6/2004 | Miyoshi |
| 2005/0212008 A1 | 9/2005 | Miyoshi |
| 2006/0073347 A1 | 4/2006 | Morita et al. |
| 2007/0112147 A1 | 5/2007 | Morita et al. |
| 2007/0197755 A1* | 8/2007 | Sueyoshi et al. ............... 528/15 |
| 2008/0033120 A1 | 2/2008 | Yoshitake et al. |
| 2008/0042142 A1 | 2/2008 | Sugawara et al. |
| 2009/0118440 A1 | 5/2009 | Nakanishi et al. |

FOREIGN PATENT DOCUMENTS

| | | |
|---|---|---|
| JP | 7-294701 A | 11/1995 |
| JP | 2002-265787 A | 9/2002 |
| JP | 2002-348473 A | 12/2002 |
| JP | 2002-356617 A | 12/2002 |
| JP | 2004-43815 A | 2/2004 |
| JP | 2004-143361 A | 5/2004 |
| JP | 2004-186168 A | 7/2004 |
| JP | 2005-105217 A | 4/2005 |
| JP | 2005-162859 A | 6/2005 |
| JP | 2005-325174 A | 11/2005 |
| JP | 2006-206721 A | 8/2006 |
| JP | 2007-8996 A | 1/2007 |
| JP | 2007-31619 A | 2/2007 |
| JP | 2011-202057 A | 10/2011 |

OTHER PUBLICATIONS

International Search Report issued in PCT/JP2011/075063, dated Feb. 14, 2012.

* cited by examiner

*Primary Examiner* — Kuo-Liang Peng
(74) *Attorney, Agent, or Firm* — Birch, Stewart, Kolasch & Birch, LLP

(57) ABSTRACT

Disclosed is a curable resin composition which includes a ladder-type silsesquioxane (A) having an aliphatic carbon-carbon double bond in the molecule; a ladder-type silsesquioxane (B) having a Si—H bond in the molecule; and a hydrosilylation catalyst. The curable resin composition is useful as sealants typically for optical semiconductor elements. Also disclosed is a cured article which is obtained by curing the curable resin composition. The curable resin composition can give such a cured article having properties including resistance to elevated temperatures, flexibility, transparency, resistance to thermal yellowing, and resistance to photoyellowing.

10 Claims, No Drawings

CURABLE RESIN COMPOSITION AND CURED ARTICLE

TECHNICAL FIELD

The present invention relates to a curable resin composition, a sealant including the curable resin composition, and cured articles derived from them.

BACKGROUND ART

Materials having such heat resistance as to endure temperatures of 150° C. or above have been demanded as materials for covering semiconductor elements in semiconductor devices which require high heat resistance and high voltage endurance. Among them, materials for covering optical materials such as light emitting diode (LED) elements have been demanded to have, in addition to heat resistance, properties such as flexibility, transparency, resistance to thermal yellowing, and resistance to photoyellowing.

A synthetic polymer compound has been reported as a material having high heat resistance and good heat dissipation (Patent Literature (PTL) 1). The synthetic polymer compound includes at least one third organosilicon polymer having a molecular weight of 20000 to 800000, in which the third organosilicon polymer includes at least one kind of first organosilicon polymer and at least one kind of second organosilicon polymer bonded with each other through siloxane bonds, the first organosilicon polymer has a crosslinked structure connected through a siloxane (Si—O—Si bonded structure), and the second organosilicon polymer has a linear connection structure connected through a siloxane. Such material, however, has properties not yet satisfactory.

A resin composition for sealing an optical element has been disclosed as a resin composition for sealing optical element, which excels in transparency, ultraviolet resistance, and resistance to thermal coloration (PTL 2). This resin composition includes, as a resin component, at least one silsesquioxane selected from the group consisting of a liquid silsesquioxane having a cage structure and containing an aliphatic carbon-carbon unsaturated bond but no hydrogen-silicon (H—Si) bond; and a liquid silsesquioxane having a cage structure and containing a H—Si bond but no aliphatic carbon-carbon unsaturated bond. Cured articles derived from such cage silsesquioxanes, however, are relatively rigid, have poor flexibility, and are susceptible to cracking or fracture.

CITATION LIST

Patent Literature

PTL 1: Japanese Unexamined Patent Application Publication (JP-A) No. 2006-206721
PTL 2: JP-A No. 2007-31619

SUMMARY OF INVENTION

Technical Problem

An object of the present invention is to provide a curable resin composition which gives a cured article having properties such as resistance to elevated temperatures, flexibility, transparency, resistance to thermal yellowing, and resistance to photoyellowing.

Another object of the present invention is to provide a sealant which exhibits, after curing, properties such as resistance to elevated temperatures, flexibility, transparency, resistance to thermal yellowing, and resistance to photoyellowing.

Yet another object of the present invention is to provide a cured article which has properties such as resistance to elevated temperatures, flexibility, transparency, resistance to thermal yellowing, and resistance to photoyellowing.

Solution to Problem

After intensive investigations to achieve the objects, the present inventors have found that a composition including two different ladder-type silsesquioxanes having specific structures and a hydrosilylation catalyst, when cured, gives a cured article which excels in properties such as resistance to elevated temperatures, flexibility, transparency, resistance to thermal yellowing, and resistance to photoyellowing. The present invention has been made based on these findings.

Specifically, the present invention provides a curable resin composition which includes a ladder-type silsesquioxane (A) having an aliphatic carbon-carbon double bond in a molecule; a ladder-type silsesquioxane (B) having a Si—H bond in a molecule; and a hydrosilylation catalyst.

The present invention also provides a sealant including the curable resin composition.

In addition and advantageously, the present invention provides a cured article obtained by curing the curable resin composition.

Advantageous Effects of Invention

A curable resin composition according to the present invention includes a ladder-type silsesquioxane (A) having an aliphatic carbon-carbon double bond in a molecule; a ladder-type silsesquioxane (B) having a Si—H bond in a molecule; and a hydrosilylation catalyst. The curable resin composition, when thermally cured, undergoes a hydrosilylation reaction and thereby yields a cured article which has superior transparency, excellent resistance to thermal yellowing at elevated temperatures, and satisfactory flexibility. This cured article does not suffer from yellowing even when exposed to elevated temperatures of 150° C. or above over a long duration, is highly flexible, and is resistant to cracking and fracture. For these reasons, the curable resin composition according to the present invention is useful as sealants for next-generation light sources.

DESCRIPTION OF EMBODIMENTS

[Curable Resin Composition]

A curable resin composition according to an embodiment of the present invention includes a ladder-type silsesquioxane (A) having an aliphatic carbon-carbon double bond in a molecule; a ladder-type silsesquioxane (B) having a Si—H bond in a molecule; and a hydrosilylation catalyst.

[Ladder-Type Silsesquioxanes]

Ladder-type silsesquioxanes are polysiloxanes each having a crosslinked three-dimensional structure. Such polysiloxanes are compounds having a principal chain including siloxane bonds (Si—O—Si), and basic constitutional units of which are classified as units of following Formulae (M), (D), (T), and (Q) (hereinafter also referred to as M unit, D unit, T unit, and Q unit, respectively).

[Chem. 1]

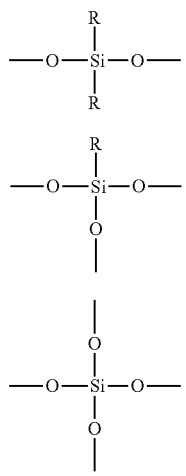

In the formulae, R represents an atom or atomic group bonded to silicon atom. The M unit is a unit including a monovalent group containing a silicon atom bonded to one oxygen atom; the D unit is a unit including a divalent group containing a silicon atom bonded to two oxygen atoms; the T unit is a unit including a trivalent group containing a silicon atom bonded to three oxygen atoms; and the Q unit is a unit including a quadrivalent group containing a silicon atom bonded to four oxygen atoms.

Silsesquioxanes are polysiloxanes including the T units as basic constitutional units, and an experimental formula (basic structural formula) of which is represented by $RSiO_{3/2}$. Known Si—O—Si skeleton structures of silsesquioxanes include a random structure, a ladder structure, and a cage structure. Ladder-type silsesquioxanes contained in the curable resin composition according to the present invention are silsesquioxanes having Si—O—Si skeletons of the ladder structure.

Ladder-type silsesquioxanes may be represented typically by following Formula (L):

[Chem. 2]

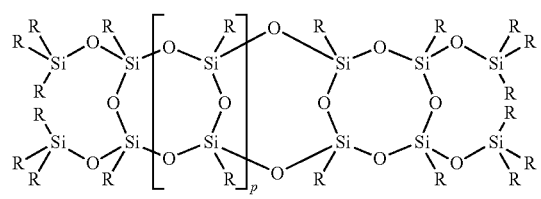

(L)

In Formula (L), p represents an integer of 1 or more (typically 1 to 5000, preferably 1 to 2000, and more preferably 1 to 1000). Rs may be the same as or different from one another and are typified by hydrogen atom, substituted or unsubstituted hydrocarbon groups, hydroxyl group, alkoxy groups, alkenyloxy groups, aryloxy groups, aralkyloxy groups, acyloxy groups, mercapto group (thiol group), alkylthio groups, alkenylthio groups, arylthio groups, aralkylthio groups, carboxyl group, alkoxycarbonyl groups, aryloxycarbonyl groups, aralkyloxycarbonyl groups, amino group or substituted amino groups (e.g., mono- or di-alkylamino groups and acylamino groups), epoxy group, halogen atoms, and groups represented by following Formula (1):

[Chem. 3]

(1)

Rs in Formula (1) may be the same as or different from one another and are defined as with Rs in Formula (L).

The hydrocarbon groups are typified by aliphatic hydrocarbon groups, alicyclic hydrocarbon groups, aromatic hydrocarbon groups, and groups each including two or more of them bonded to each other. Exemplary aliphatic hydrocarbon groups include alkyl groups, alkenyl groups, and alkynyl groups. The alkyl groups are typified by $C_{1-20}$ alkyl groups such as methyl, ethyl, propyl, isopropyl, butyl, hexyl, octyl, isooctyl, decyl, and dodecyl groups, of which $C_{1-10}$ alkyl groups are preferred, and $C_{1-4}$ alkyl groups are more preferred. The alkenyl groups are typified by $C_{2-20}$ alkenyl groups such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl groups, of which $C_{2-10}$ alkenyl groups are preferred, and $C_{2-4}$ alkenyl groups are more preferred. The alkynyl groups are typified by $C_{2-20}$ alkynyl groups such as ethynyl and propynyl groups, of which $C_{2-10}$ alkynyl groups are preferred, and $C_{2-4}$ alkynyl groups are more preferred.

The alicyclic hydrocarbon groups are exemplified by $C_{3-12}$ cycloalkyl groups such as cyclopropyl, cyclobutyl, cyclopentyl, cyclohexyl, and cyclododecyl groups; $C_{3-12}$ cycloalkenyl groups such as cyclohexenyl group; and $C_{4-15}$ bridged hydrocarbon groups such as bicycloheptyl and bicycloheptenyl groups.

The aromatic hydrocarbon groups are typified by $C_{6-14}$ aryl groups such as phenyl and naphthyl groups, of which $C_{6-10}$ aryl groups are preferred.

Exemplary groups each including an aliphatic hydrocarbon group and an alicyclic hydrocarbon group bonded to each other include cyclohexylmethyl and methylcyclohexyl groups. Exemplary groups each including an aliphatic hydrocarbon group and an aromatic hydrocarbon group bonded to each other include $C_{7-18}$ aralkyl groups such as benzyl and phenethyl groups, of which $C_{7-10}$ aralkyl groups are preferred; ($C_{6-10}$ aryl)-($C_{2-6}$ alkenyl) groups such as cinnamyl group; ($C_{1-4}$ alkyl)-substituted aryl groups such as tolyl group; and ($C_{2-4}$ alkenyl)-substituted aryl groups such as styryl group.

The hydrocarbon groups may each have one or more substituents. Such substituents may each have 0 to 20 carbon atoms, and preferably 0 to 10 carbon atoms. The substituents are typified by halogen atoms such as fluorine atom, chlorine atom, and bromine atom; hydroxyl group; alkoxy groups such as methoxy and ethoxy groups; alkenyloxy groups such as allyloxy group; aryloxy groups such as phenoxy group; aralkyloxy groups such as benzyloxy group; acyloxy groups such as acetyloxy, propionyloxy, (meth)acryloyloxy, and benzoyloxy groups; mercapto group; alkylthio groups such as methylthio and ethylthio groups; alkenylthio groups such as allylthio group; arylthio groups such as phenylthio group; aralkylthio groups such as benzylthio group; carboxyl group; alkoxycarbonyl groups such as methoxycarbonyl and ethoxycarbonyl groups; aryloxycarbonyl groups such as phenyloxycarbonyl group; aralkyloxycarbonyl groups such as benzyloxycarbonyl group; amino group; mono- or di-alkylamino groups such as methylamino, dimethylamino, and diethylamino groups; acylamino groups such as acetylamino and benzoylamino groups; epoxy-containing groups such as glycidyloxy group; oxetanyl-containing groups such as ethyloxetanyloxy group; acyl groups such as acetyl, propionyl, and benzoyl groups; oxo group; and groups each including two or more of these groups bonded to each other, where necessary, through the medium of a $C_{1-6}$ alkylene group.

The alkoxy groups as Rs are typified by $C_{1-6}$ alkoxy groups such as methoxy, ethoxy, propoxy, isopropyloxy, butoxy, and isobutyloxy groups, of which $C_{1-4}$ alkoxy groups are preferred. The alkenyloxy groups are typified by $C_{2-6}$ alkenyloxy groups such as allyloxy group, of which $C_{2-4}$ alkenyloxy groups are preferred. The aryloxy groups are exemplified by $C_{6-14}$ aryloxy groups which may have one or more substituents on aromatic ring, such as phenoxy, tolyloxy, and naphthyloxy groups. The substituents herein are typified by $C_{1-4}$ alkyl groups, $C_{2-4}$ alkenyl groups, halogen atoms, and $C_{1-4}$ alkoxy groups. The aralkyloxy groups are exemplified by $C_{7-18}$ aralkyloxy groups such as benzyloxy and phenethyloxy groups. The acyloxy groups are typified by $C_{1-12}$ acyloxy groups such as acetyloxy, propionyloxy, and benzoyloxy groups.

The alkylthio groups are typified by $C_{1-6}$ alkylthio groups such as methylthio and ethylthio groups, of which $C_{1-4}$ alkylthio groups are preferred. The alkenylthio groups are typified by $C_{2-6}$ alkenylthio groups such as allylthio group, of which $C_{2-4}$ alkenylthio groups are preferred. The arylthio groups are exemplified by $C_{6-14}$ arylthio groups which may have one or more substituents on aromatic ring, such as phenylthio, tolylthio, and naphthylthio groups. The substituents herein include $C_{1-4}$ alkyl groups, $C_{2-4}$ alkenyl groups, halogen atoms, and $C_{1-4}$ alkoxy groups. The aralkylthio groups are typified by $C_{7-18}$ aralkylthio groups such as benzylthio and phenethylthio groups. The alkoxycarbonyl groups are typified by ($C_{1-6}$ alkoxy)-carbonyl groups such as methoxycarbonyl, ethoxycarbonyl, propoxycarbonyl, and butoxycarbonyl groups. The aryloxycarbonyl groups are typified by ($C_{6-14}$ aryloxy)-carbonyl groups such as phenoxycarbonyl, tolyloxycarbonyl, and naphthyloxycarbonyl groups. The aralkyloxycarbonyl groups are typified by ($C_{7-18}$ aralkyloxy)-carbonyl groups such as benzyloxycarbonyl group. The mono- or di-alkylamino groups are typified by mono- or di-($C_{1-6}$ alkylamino groups such as methylamino, ethylamino, dimethylamino, and diethylamino groups. The acylamino groups are typified by acylamino groups such as acetylamino, propionylamino, and benzoylamino groups. The halogen atoms are exemplified by chlorine atom, bromine atom, and iodine atom.

Each of Rs in the groups represented by Formula (1) is preferably independently one selected from hydrogen atom; $C_{1-10}$ alkyl groups (preferably $C_{1-4}$ alkyl groups); $C_{2-10}$ alkenyl groups (preferably $C_{2-4}$ alkenyl groups); $C_{3-12}$ cycloalkyl groups; $C_{3-12}$ cycloalkenyl groups; $C_{6-14}$ aryl groups which may have, on the aromatic ring, one or more substituents such as $C_{1-4}$ alkyl groups, $C_{2-4}$ alkenyl groups, halogen atoms, and $C_{1-4}$ alkoxy groups; $C_{7-18}$ aralkyl groups; ($C_{6-10}$ aryl)-($C_{2-6}$ alkenyl) groups; hydroxyl group; $C_{1-6}$ alkoxy groups; and halogen atoms.

In the ladder-type silsesquioxanes represented by Formula (L), substituted or unsubstituted hydrocarbon groups may constitute preferably 50 mole percent or more, more preferably 80 mole percent or more, and particularly preferably 90 mole percent or more, of Rs. Particularly, alkyl groups having 1 to 10 carbon atoms (preferably methyl, ethyl, and other alkyl groups having 1 to 4 carbon atoms), aryl groups having 6 to 10 carbon atoms (preferably phenyl group), aralkyl groups having 7 to 10 carbon atoms (preferably benzyl group) constitute, in a total, preferably 50 mole percent or more, more preferably 80 mole percent or more, and particularly preferably 90 mole percent or more, of Rs. Each of these groups may be substituted or unsubstituted.

Ladder-type silsesquioxanes may be prepared according to known methods. Typically, the ladder-type silsesquioxanes represented by Formula (L) may be prepared by subjecting to a hydrolytic condensation reaction (sol-gel reaction) one or more hydrolyzable silane compounds represented by following Formula (2):

[Chem. 4]

wherein R is as defined above; and three Xs are the same as or different from one another and each represent a hydrolyzable group or hydroxyl group; or one or more hydrolyzable silane compounds represented by Formula (1) in combination with one or more silane compounds represented by following Formula (3) or (3'):

[Chem. 5]

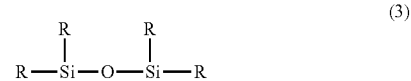

wherein Rs and X are as defined above, where plural Rs may be the same as or different from one another.

The hydrolyzable silane compounds represented by Formula (2) contribute to the formation of T units of ladder-type silsesquioxanes; and the silane compounds represented by Formula (3) or (3') act as an end-capping agent and contribute to the formation of M units of ladder-type silsesquioxanes.

The hydrolyzable groups as Xs are not limited, as long as being groups capable of forming a siloxane bond through hydrolysis and silanol condensation, and are typified by halogen atoms such as chlorine atom, bromine atom, and iodine atom; $C_{1-10}$ alkoxy groups such as methoxy, ethoxy, and propoxy groups; and $C_{1-10}$ acyloxy groups such as acetyloxy, propionyloxy, and benzoyloxy groups. Among them, chlorine atom and $C_{1-4}$ alkoxy groups are preferred.

The hydrolytic condensation reaction can be performed typically by subjecting the silane compound to silanol condensation in the presence of a silanol condensation catalyst in water or in a solvent mixture of water and an organic solvent; and distilling off the solvent and/or by-products (such as alcohols) during or after the reaction. The reaction may be performed at a temperature of −78° C. to 150° C., and preferably −20° C. to 100° C. Water is used in an amount of 1 mole or more (e.g., 1 to 20 moles, and preferably 1 to 10 moles) per 1 mole of the total amount of silane compounds.

The organic solvent is exemplified by aliphatic hydrocarbons such as hexane, heptane, and octane; alicyclic hydrocarbons such as cyclohexane; aromatic hydrocarbons such as benzene, toluene, xylenes, and ethylbenzene; halogenated hydrocarbons such as chloroform, dichloromethane, and 1,2-dichloroethane; ethers such as diethyl ether, dimethoxyethane, tetrahydrofuran, and dioxane; ketones such as acetone, methyl ethyl ketone, and methyl isobutyl ketone; esters such as methyl acetate, ethyl acetate, isopropyl acetate, and butyl acetate; amides such as N,N-dimethylformamide and N,N-dimethylacetamide; nitriles such as acetonitrile, propionitrile, and benzonitrile; alcohols such as methanol, ethanol, isopropyl alcohol, and butanol; and mixtures of these solvents. The organic solvent may be used in an amount of typically 0.5 to 30 parts by volume per 1 part by volume of the total volume of silane compounds.

The silanol condensation catalyst can be any of acid catalysts and base catalysts. Exemplary acid catalysts include mineral acids such as hydrochloric acid, sulfuric acid, nitric acid, phosphoric acid, and boric acid; phosphoric esters; carboxylic acids such as acetic acid and trifluoroacetic acid; sulfonic acids such as methanesulfonic acid, trifluoromethanesulfonic acid, and p-toluenesulfonic acid; solid acids such as activated clay; and Lewis acids such as iron chloride. Exemplary base catalysts include alkali metal hydroxides such as sodium hydroxide and potassium hydroxide; alkaline earth metal hydroxides such as barium hydroxide and magnesium hydroxide; alkali metal carbonates such as sodium carbonate; alkaline earth metal carbonates such as barium carbonate and magnesium carbonate; alkali metal hydrogen carbonates such as sodium hydrogen carbonate; alkali metal alkoxides such as sodium methoxide and sodium ethoxide; alkaline earth metal alkoxides such as barium methoxide; alkali metal phenoxides such as sodium phenoxide; quaternary ammonium hydroxides including tetraalkylammonium hydroxides such as tetramethylammonium hydroxide and tetrabutylammonium hydroxide; quaternary phosphonium hydroxides including tetraalkylphosphonium hydroxides such as tetramethylammonium hydroxide and tetrabutylphosphonium hydroxide; amines including tertiary amines such as triethylamine, N-methylpiperidine, 4-dimethylaminopyridine, and 1,8-diazabicyclo[5.4.0]-7-undecene (DBU); and nitrogen-containing aromatic heterocyclic compounds such as pyridine. The silanol condensation catalyst can also be a fluorine compound such as tetrabutylammonium fluoride, potassium fluoride, or sodium fluoride.

A reaction product can be separated and purified by a separation process such as water washing, acid washing, alkali washing, filtration, concentration, distillation, extraction, crystallization, recrystallization, or column chromatography, or a separation process as a combination of them.

[Ladder-Type Silsesquioxane (A) Having Aliphatic Carbon-Carbon Double Bond in Molecule]

The ladder-type silsesquioxane (A) having an aliphatic carbon-carbon double bond in a molecule [hereinafter also simply referred to as "ladder-type silsesquioxane (A)"] is not limited, as long as being a compound belonging to the ladder-type silsesquioxanes and having an aliphatic carbon-carbon double bond at a terminus or in a side chain, and is typified by ladder-type silsesquioxanes represented by Formula (L) in which at least one of terminal Rs and/or at least one of Rs as side chains is a group having an aliphatic carbon-carbon double bond.

Examples of the group having an aliphatic carbon-carbon double bond include $C_{2-20}$ alkenyl groups such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl groups, of which $C_{2-10}$ alkenyl groups are preferred, and $C_{2-4}$ alkenyl groups are more preferred; $C_{3-12}$ cycloalkenyl groups such as cyclohexenyl group; $C_{4-15}$ bridged unsaturated hydrocarbon groups such as bicycloheptenyl group; ($C_{2-4}$ alkenyl)-substituted aryl groups such as styryl group; and cinnamyl group. Examples of the group having an aliphatic carbon-carbon double bond further include groups represented by Formula (1), in which at least one of the three Rs is one of the groups mentioned above, such as $C_{2-20}$ alkenyl groups, $C_{3-12}$ cycloalkenyl groups, $C_{4-15}$ bridged unsaturated hydrocarbon groups, ($C_{2-4}$ alkenyl)-substituted aryl groups, and cinnamyl group.

The ladder-type silsesquioxane (A) has a molecular weight of typically 100 to 800000, preferably 200 to 100000, more preferably 300 to 10000, and particularly preferably 500 to 4000. A ladder-type silsesquioxane (A) having a molecular weight within this range may be a liquid with a low viscosity, thereby have satisfactory miscibility (compatibility) with the ladder-type silsesquioxane (B) and be easy to handle. The ladder-type silsesquioxane (A) may be a mixture of those having different molecular weights within the above-specified range. The ladder-type silsesquioxane (A) may contain aliphatic carbon-carbon double bond(s) in a content of typically 0.0010 to 0.0040 mmol/g, and preferably 0.0012 to 0.0030 mmol/g. The ladder-type silsesquioxane (A) may contain aliphatic carbon-carbon double bond(s) in a percentage (by weight) in terms of vinyl group of typically 3.0% to 9.0%, and preferably 3.7% to 5.7%.

The ladder-type silsesquioxane (A) may be prepared according to the preparation method for ladder-type silsesquioxanes by using, as the hydrolyzable silane compound represented by Formula (2), at least a compound including a group having an aliphatic carbon-carbon double bond as R or by using, as the silane compound represented by Formula (3) or (3'), at least a compound including a group having an aliphatic carbon-carbon double bond as at least one of Rs.

The ladder-type silsesquioxane (A) may also be prepared by allowing, of ladder-type silsesquioxanes represented by Formula (L), a ladder-type silsesquioxane (A1) having at least one hydrolyzable group or hydroxyl group as R (hereinafter also simply referred to as a "ladder-type silsesquioxane (A1)") to react with at least one silane compound (C) represented by following Formula (4):

[Chem. 6]

(4)

wherein Rs are as defined above, where three Rs may be the same as or different from one another, but at least one of Rs is a group having an aliphatic carbon-carbon double bond; and X represents a hydrolyzable group or hydroxyl group.

Examples of the hydrolyzable group as R in the ladder-type silsesquioxane (A1), the hydrolyzable group as X and the group having an aliphatic carbon-carbon double bond as R in the silane compound (C) represented by Formula (4) are as with the aforementioned hydrolyzable group and the group having an aliphatic carbon-carbon double bond. Among them, the hydrolyzable group as R in the ladder-type silsesquioxane (A1) is preferably a $C_{1-4}$ alkoxy group such as methoxy or ethoxy group.

The other Rs than the group having an aliphatic carbon-carbon double bond in the silane compound (C) represented by Formula (4) may be the same as or different from each other and are each preferably an alkyl group having 1 to 10 carbon atoms (more preferably methyl, ethyl, or another alkyl group having 1 to 4 carbon atoms), an aryl group having 6 to 10 carbon atoms (more preferably phenyl group), or an aralkyl group having 7 to 10 carbon atoms (more preferably benzyl group), each of which may be substituted or unsubstituted.

More specifically, the silane compound (C) represented by Formula (4) is typified by mono-halogenated vinylsilanes, mono-halogenated allylsilanes, mono-halogenated 3-butenylsilanes, monoalkoxyvinylsilanes, monoalkoxyallylsilanes, and monoalkoxy-3-butenylsilanes.

The mono-halogenated vinylsilanes are represented by chlorodimethylvinylsilane, chloroethylmethylvinylsilane, chloromethylphenylvinylsilane, chlorodiethylvinylsilane, chloroethylphenylvinylsilane, and chlorodiphenylvinylsilane.

The mono-halogenated allylsilanes are represented by allylchlorodimethylsilane, allylchloroethylmethylsilane, allylchloromethylphenylsilane, allylchlorodiethylsilane, allylchloroethylphenylsilane, and allylchlorodiphenylsilane.

The mono-halogenated 3-butenylsilanes are represented by 3-butenylchlorodimethylsilane, 3-butenylchloroethylmethylsilane, 3-butenylchloromethylphenylsilane, 3-butenylchlorodiethylsilane, 3-butenylchloroethylphenylsilane, and 3-butenylchlorodiphenylsilane.

The monoalkoxyvinylsilanes are represented by methoxydimethylvinylsilane, ethylmethoxymethylvinylsilane, methoxymethylphenylvinylsilane, diethylmethoxyvinylsilane, ethylmethoxyphenylvinylsilane, methoxydiphenylvinylsilane, ethoxydimethylvinyisilane, ethoxyethylmethylvinylsilane, ethoxymethylphenylyinylsilane, ethoxydiethylvinylsilane, and ethoxyethylphenylvinylsilane.

The monoalkoxyallylsilanes are represented by allylmethoxydimethylsilane, allylethylmethoxymethylsilane, allylmethoxymethylphenylsilane, allyldiethylmethoxysilane, allylethylmethoxyphenylsilane, allylmethoxydiphenylsilane, allylethoxydimethylsilane, allylethoxyethylmethylsilane, allylethoxymethylphenylsilane, allylethoxydiethylsilane, and allylethoxyethylphenylsilane.

The monoalkoxy-3-butenylsilanes are represented by 3-butenylmethoxydimethylsilane, 3-butenylethylmethoxymethylsilane, 3-butenylmethoxymethylphenylsilane, 3-butenyldiethylmethoxysilane, 3-butenylethylmethoxyphenylsilane, 3-butenylmethoxydiphenylsilane, 3-butenylethoxydimethylsilane, 3-butenylethoxyethylmethylsilane, 3-butenylethoxymethylphenylsilane, 3-butenylethoxydiethylsilane, 3-butenylethoxyethylphenylsilane, and 3-butenylethoxydiphenylsilane.

The reaction between the ladder-type silsesquioxane (A1) and the silane compound (C) represented by Formula (4) is generally performed in a solvent. The solvent is typified by aliphatic hydrocarbons such as hexane, heptane, and octane; alicyclic hydrocarbons such as cyclohexane; aromatic hydrocarbons such as benzene, toluene, xylenes, and ethylbenzene; halogenated hydrocarbons such as chloroform, dichloromethane, and 1,2-dichloroethane; ethers such as diethyl ether, dimethoxyethane, tetrahydrofuran, and dioxane; ketones such as acetone, methyl ethyl ketone, and methyl isobutyl ketone; esters such as methyl acetate, ethyl acetate, isopropyl acetate, and butyl acetate; amides such as N,N-dimethylformamide and N,N-dimethylacetamide; nitriles such as acetonitrile, propionitrile, and benzonitrile; and alcohols such as methanol, ethanol, isopropyl alcohol, and butanol. Each of different solvents may be used alone or in combination.

The silane compound (C) represented by Formula (4) may be used in an amount of typically about 1 to about 20 moles, preferably about 2 to about 10 moles, and more preferably about 5 to about 9 moles, per 1 mole of entire reactive groups (hydrolyzable groups and hydroxyl groups) in the ladder-type silsesquioxane (A1).

The reaction between the ladder-type silsesquioxane (A1) and the silane compound (C) represented by Formula (4) is performed in the presence of a silanol condensation catalyst. The silanol condensation catalyst may be any of the above-exemplified ones. The silanol condensation catalyst is preferably a base catalyst.

The silanol condensation catalyst may be used in an amount of typically 0.1 to 10 moles, and preferably 0.1 to 1.0 moles, per 1 mole of entire reactive groups (hydrolyzable groups and hydroxyl groups) in the ladder-type silsesquioxane (A1). The silanol condensation catalyst may be used in a catalytic amount.

The reaction may be performed in the presence of a polymerization inhibitor. The reaction temperature may be suitably chosen depending typically on types of reaction components and catalyst, but is generally 0° C. to 200° C., preferably 20° C. to 100° C., and more preferably 30° C. to 60° C. The reaction may be performed under normal atmospheric pressure, under reduced pressure, or under pressure (under a load). The reaction atmosphere is not limited and can be any of atmospheres such as air atmosphere, nitrogen atmosphere, and argon atmosphere, as long as not adversely affecting the reaction. The reaction can be performed according to any system such as a batch system, semi-batch system, or continuous system.

The method allows reactive groups (hydroxyl group; and hydrolyzable groups such as alkoxy groups) in the ladder-type silsesquioxane (A1) to undergo hydrolytic condensation (or condensation) with reactive groups (hydroxyl group; and hydrolyzable groups such as alkoxy groups) in the silane compound (C) represented by Formula (4) to give a corresponding ladder-type silsesquioxane (A) having an aliphatic carbon-carbon double bond in a molecule.

A reaction product after the completion of the reaction may be separated and purified by a separation process such as water washing, acid washing, alkali washing, filtration, concentration, distillation, extraction, crystallization, recrystallization, or column chromatography, or a separation process as a combination of them.

[Ladder-Type Silsesquioxane (B) Having Si—H Bond in Molecule]

The ladder-type silsesquioxane (B) having a Si—H bond in a molecule [hereinafter also simply referred to as "ladder-type silsesquioxane (B)"] is not limited, as long as being a compound belonging to the ladder-type silsesquioxanes and having a Si—H bond at a terminus or in a side chain, and is typified by ladder-type silsesquioxanes represented by Formula (L) where at least one of terminal Rs and/or at least one of Rs as side chains is hydrogen atom or a group having a Si—H bond. The group having a Si—H bond is exemplified by groups represented by Formula (1) where at least one of three Rs is hydrogen atom.

The ladder-type silsesquioxane (B) has a molecular weight of typically 100 to 800000, preferably 200 to 100000, more preferably 300 to 10000, and particularly preferably 500 to 4000. A ladder-type silsesquioxane (B) having a molecular weight within this range is preferred for its satisfactory miscibility with the ladder-type silsesquioxane (A). The ladder-type silsesquioxane (B) for use herein may also be a mixture containing ladder-type silsesquioxanes having different molecular weights within the above-specified range. The ladder-type silsesquioxane (B) may contain Si—H bond(s) in a content of typically 0.0001 to 0.005 mmol/g, and preferably 0.0005 to 0.002 mmol/g. The ladder-type silsesquioxane (B) may contain Si—H group(s) in a percentage (by weight) of typically 0.01% to 0.30%, and preferably 0.1% to 0.2%.

The ladder-type silsesquioxane (B) may be prepared according to the preparation method for ladder-type silsesquioxane by using, as the hydrolyzable silane compound represented by Formula (2), at least a compound including hydrogen atom as R, or by using, as the silane compound represented by Formula (3) or (3'), at least a compound including hydrogen atom as at least one of Rs.

The ladder-type silsesquioxane (B) may also be prepared by allowing, of ladder-type silsesquioxanes represented by Formula (L), a ladder-type silsesquioxane (A1) having at least one hydrolyzable group or hydroxyl group as R [ladder-type silsesquioxane (A1)] to react with at least one silane compound (D) represented by following Formula (5):

[Chem. 7]

(5)

wherein Rs are as defined above, where three Rs may be the same as or different from one another, but at least one of Rs is hydrogen atom; and X represents a hydrolyzable group or hydroxyl group.

Examples of the hydrolyzable group as R in the ladder-type silsesquioxane (A1) and the hydrolyzable group as X in the silane compound (D) represented by Formula (5) are as with the above-mentioned hydrolyzable group. Among them, the hydrolyzable group as R in the ladder-type silsesquioxane (A1) is preferably a $C_{1-4}$ alkoxy group such as methoxy or ethoxy group.

The other Rs than hydrogen atom in the silane compound (D) represented by Formula (5) may be the same as or different from each other and are each preferably an alkyl group having 1 to 10 carbon atoms (more preferably methyl, ethyl, or another alkyl group having 1 to 4 carbon atoms), an aryl group having 6 to 10 carbon atoms (more preferably phenyl group), or an aralkyl group having 7 to 10 carbon atoms (more preferably benzyl group), each of which may be substituted or unsubstituted.

More specifically, the silane compound (D) represented by Formula (5) is typified by mono-halogenated silanes and monoalkoxysilanes.

The mono-halogenated silanes are represented by chlorodimethylsilane, chloroethylmethylsilane, chloromethylphenylsilane, chlorodiethylsilane, chloroethylphenylsilane, and chlorodiphenylsilane.

The monoalkoxysilanes are represented by methoxydimethylsilane, ethylmethoxymethylsilane, methoxymethylphenylsilane, diethylmethoxysilane, ethylmethoxyphenylsilane, methoxydiphenylsilane, ethoxydimethylsilane, ethoxyethylmethylsilane, ethoxymethylphenylsilane, ethoxydiethylsilane, and ethoxyethylphenylsilane.

The reaction between the ladder-type silsesquioxane (A1) and the silane compound (D) represented by Formula (5) is generally performed in a solvent. The solvent may be as with the solvent for use in the reaction between the ladder-type silsesquioxane (A1) and the silane compound (C) represented by Formula (4).

The silane compound (D) represented by Formula (5) may be used in an amount of typically about 1 to about 30 moles, preferably about 1 to about 10 moles, and more preferably about 5 to about 9 moles, per 1 mole of entire reactive groups (hydrolyzable groups and hydroxyl groups) in the ladder-type silsesquioxane (A1).

The reaction between the ladder-type silsesquioxane (A1) and the silane compound (D) represented by Formula (5) is performed in the presence of a silanol condensation catalyst. The silanol condensation catalyst for use herein may generally be an acid catalyst belonging to the silanol condensation catalysts. A basic catalyst may disadvantageously react with the silane compound (D) represented by Formula (5).

The silanol condensation catalyst may be used in an amount of typically 0.001 to 1 mole, and preferably 0.002 to 0.01 mole, per 1 mole of entire reactive groups (hydrolyzable groups and hydroxyl groups) in the ladder-type silsesquioxane (A1). The silanol condensation catalyst may be used in a catalytic amount.

The reaction may be performed in the presence of a polymerization inhibitor. The reaction temperature may be chosen depending typically on types of reaction components and catalyst, but is generally −78° C. to 120° C., preferably −30° C. to 60° C., and more preferably −10° C. to 30° C. The reaction may be performed under normal atmospheric pressure, under reduced pressure, or under pressure (under a load). The reaction atmosphere is not limited and can be any of atmospheres such as air atmosphere, nitrogen atmosphere, and argon atmosphere, as long as not adversely affecting the reaction. The reaction can be performed according to any system such as a batch system, semi-batch system, or continuous system.

The method allows reactive groups (hydroxyl group; and hydrolyzable groups such as alkoxy groups) in the ladder-type silsesquioxane (A1) to undergo hydrolytic condensation (or condensation) with reactive groups (hydroxyl group; and hydrolyzable groups such as alkoxy groups) in the silane compound (D) represented by Formula (5) to give a corresponding ladder-type silsesquioxane (B) having a Si—H bond in a molecule.

A reaction product after the completion of the reaction may be separated and purified by a separation process such as water washing, acid washing, alkali washing, filtration, concentration, distillation, extraction, crystallization, recrystallization, or column chromatography, or a separation process as a combination of them.

[Hydrosilylation Catalyst]

The hydrosilylation catalyst contained in the curable resin composition according to the present invention is typified by known catalysts for hydrosilylation reactions, such as platinum catalysts, rhodium catalysts, and palladium catalysts. Specifically, the hydrosilylation catalyst is typified by platinum catalysts such as platinum fine powders, platinum black, supported platinum on silica fine powders, supported platinum on activated carbons, chloroplatinic acid, complexes of chloroplatinic acid typically with alcohols, aldehydes, or ketones, complexes of platinum with olefins, carbonyl complexes of platinum (e.g., a platinum-carbonylvinylmethyl complex), platinum-vinylmethylsiloxane complexes (e.g., platinum-divinyltetramethyldisiloxane complex and platinum-cyclovinylmethylsiloxane complex), platinum-phosphine complexes, and platinum-phosphite complexes; as well as palladium catalysts or rhodium catalysts corresponding to the platinum catalysts, except for containing palladium atom or rhodium atom instead of platinum atom. Each of them may be used alone or in combination. Among them, platinum-vinylmethylsiloxane complexes are preferred for exhibiting satisfactory reaction rates.

[Curable Resin Composition]

The curable resin composition according to the present invention includes at least the ladder-type silsesquioxane (A), the ladder-type silsesquioxane (B), and the hydrosilylation catalyst.

The curable resin composition according to the present invention may contain the ladder-type silsesquioxane (A) and the ladder-type silsesquioxane (B) preferably in such a ratio that Si—H bonds in the ladder-type silsesquioxane (B) are present in an amount of 0.2 to 2 moles, more preferably 0.3 to 1.5 moles, and particularly preferably 0.8 to 1.2 moles, per 1 mole of aliphatic carbon-carbon double bonds in the ladder-type silsesquioxane (A). In terms of weight ratio, the curable resin composition may contain the ladder-type silsesquioxane (B) in an amount of typically 10 to 500 parts by weight, preferably 20 to 200 parts by weight, and more preferably 30 to 120 parts by weight, per 100 parts by weight of the ladder-type silsesquioxane (A).

The curable resin composition according to the present invention may further contain one or more other polysiloxanes than the ladder-type silsesquioxane (A) and the ladder-type silsesquioxane (B). The other polysiloxanes than the ladder-type silsesquioxanes (A) and (B) are not limited and can be any polysiloxanes, as long as being compounds having a principal chain including siloxane bonds (Si—O—Si). Specifically, the other polysiloxanes than the ladder-type silsesquioxanes (A) and (B) are typified by linear, branched chain, or cyclic siloxanes; and silicone resins having a crosslinked three-dimensional structure.

Examples of the other polysiloxanes than the ladder-type silsesquioxanes (A) and (B) include Si—H type (having a Si—H bond in a molecule) or vinyl type (having an aliphatic carbon-carbon double bond in a molecule) linear poly(dialkylsiloxane)s (of which linear poly(di($C_{1-10}$ alkyl)siloxane)s are preferred) each having one to ten (preferably two to five) Si—O units, including linear poly(dimethylsiloxane)s and dimethylsilicones, such as 1,1,3,3-tetramethylsiloxane, 1,1,3,3-tetramethyl-1,3-divinylsiloxane, 1,1,3,3,5,5-hexamethyltrisiloxane, 1,1,3,3,5,5-hexamethyl-1,5-divinyltrisiloxane, 1,1,1,3,5,5,5-heptamethyltrisiloxane, heptamethyl-3-vinyltrisiloxane, 1,1,3,3,5,5,7,7-octamethyltetrasiloxane, 1,1,3,3,5,5,7,7-octamethyl-1,7-divinyltetrasiloxane, 1,1,1,3,5,5,7,7,7-nonamethyltetrasiloxane, 1,1,1,3,5,5,7,7,7-nonamethyl-3-vinyltetrasiloxane, 1,1,1,3,5,7,7,7-nonamethyl-3,5-divinyltetrasiloxane, 1,1,3,3,5,5,7,7,9,9-decamethylpentasiloxane, 1,1,3,3,5,5,7,7,9,9-decamethyl-1,9-divinylpentasiloxane, 1,1,1,3,5,5,7,7,9,9,9-undecamethylpentasiloxane, 1,1,1,3,5,5,7,7,9,9,9-undecamethyl-3-vinylpentasiloxane, and 1,1,3,3,5,5,7,7,9,9-decamethyl-1,9-divinylpentasiloxane; and Si—H type or vinyl-type cyclic poly(dialkylsiloxane)s (of which cyclic poly(di($C_{1-10}$ alkyl)siloxane)s are preferred) each having two to ten (preferably two to five) Si—O units, including cyclic poly(dimethylsiloxane)s such as hexamethylcyclotrisiloxane, octamethylcyclotetrasiloxane, and decamethylcyclopentasiloxane. As used herein the term "Si—H type" refers to a polysiloxane having a Si—H bond in a molecule, and the term "vinyl type" refers to a polysiloxane having an aliphatic carbon-carbon double bond in a molecule.

Examples of the other polysiloxanes than the ladder-type silsesquioxanes (A) and (B) further include compounds corresponding to the above-exemplified compounds, except with part or all of alkyl groups (e.g., methyl groups) being substituted by phenyl group and other aryl groups (preferably $C_{6-20}$ aryl groups), including Si—H type or vinyl type linear or cyclic poly(diarylsiloxane)s such as poly(diphenylsiloxane)s, of which poly(di($C_{6-20}$ aryl)siloxane)s are preferred; Si—H type or vinyl type linear or cyclic poly(alkylarylsiloxane)s (of which poly(($C_{1-10}$ alkyl)($C_{6-20}$ aryl)siloxane)s are preferred) such as poly(phenylmethylsiloxane)s; copolymers including the polyorganosiloxane unit(s), such as dimethylsiloxane-methylvinylsiloxane copolymers, dimethylsiloxane-methylphenylsiloxane copolymers, dimethylsiloxane-methyl(3,3,3-trifluoropropyl)siloxane copolymers, and dimethylsiloxane-methylvinylsiloxane-methylphenylsiloxane copolymers. The exemplified polysiloxanes may each have a branched chain. The curable resin composition may further contain any of silsesquioxanes having a random structure or a cage structure.

The other polysiloxanes than the ladder-type silsesquioxanes (A) and (B) may have molecular weights of typically 100 to 800000, preferably 200 to 100000, more preferably 300 to 10000, and particularly preferably 500 to 4000. A polysiloxane having a molecular weight within this range may exhibit satisfactory miscibility with the ladder-type silsesquioxanes (A) and (B). Each of other polysiloxanes than the ladder-type silsesquioxanes (A) and (B) may be used alone or in combination.

The curable resin composition according to the present invention may contain the ladder-type silsesquioxane (A) and the ladder-type silsesquioxane (B) in a total amount of typically 20 percent by weight or more, preferably 50 percent by weight or more, more preferably 80 percent by weight or more, and particularly preferably 90 percent by weight or more, based on the total amount of polysiloxanes contained in the curable resin composition. The curable resin composition, when containing the ladder-type silsesquioxane (A) and the ladder-type silsesquioxane (B) in a total amount within this range, can give a cured article excellent particularly in flexibility. The curable resin composition according to the present invention may contain polysiloxanes including the ladder-type silsesquioxane (A) and the ladder-type silsesquioxane (B) in a total content of typically 50 percent by weight or more, preferably 80 percent by weight or more, and more preferably 90 percent by weight or more based on the total weight of the curable resin composition. The curable resin composition, when containing polysiloxanes in a total content within this range, can give a cured article excellent particularly in heat resistance.

The curable resin composition according to the present invention may contain the hydrosilylation catalyst in such a content that platinum, palladium, or rhodium in the catalyst is present in an amount of preferably 0.01 to 1000 ppm by weight, and more preferably 0.1 to 500 ppm by weight, based on the total weight of the curable resin composition. The curable resin composition, when containing the hydrosilylation catalyst in a content within this range, may be advantageously protected from undergoing a remarkably low crosslinking rate and from disadvantages such as coloration in the resulting crosslinked product.

The curable resin composition according to the present invention may contain a hydrosilylation inhibitor for controlling the rate (speed) of the hydrosilylation reaction. The hydrosilylation inhibitor is typified by alkyne alcohols such as 3-methyl-1-butyn-3-ol, 3,5-dimethyl-1-hexyn-3-ol, and phenylbutynol; ene-yne compounds such as 3-methyl-3-penten-1-yne and 3,5-dimethyl-3-hexen-1-yne; as well as 1,3,5,7-tetramethyl-1,3,5,7-tetravinylcyclotetrasiloxane, 1,3,5,7-tetramethyl-1,3,5,7-tetrahexenylcyclotetrasiloxane, thiazole, benzothiazole, and benzotriazole. The curable resin composition may contain the hydrosilylation inhibitor in a content varying depending on crosslinking conditions of the composition, but practically preferably in a content of from 0.00001 to 5 percent by weight.

The heat-resistant curable composition according to the present invention may further include customary additives as arbitrary components. Such additives are typified by fillers including inorganic fillers such as precipitated silica, hydrous silica (wet silica), fumed silica, pyrogenic silica, titanium oxide, alumina, glass, quartz, aluminosilicate, iron oxides, zinc oxide, calcium carbonate, carbon black, silicon carbide, silicon nitride, and boron nitride, as well as inorganic fillers prepared by treating these fillers with an organic silicon compound such as an organohalosilane, organoalkoxysilane, or organosilazane; fine powders of organic resins such as silicone resins, epoxy resins, and fluorocarbon resins; and electroconductive powders of metals such as silver and copper. The additives are further typified by solvents; stabilizers such as antioxidants, ultraviolet absorbers, photostabilizers, and thermal stabilizers; flame retardants such as phosphorus flame retardants, halogen flame retardants, and inorganic flame retardants; flame retardant promoters; crosslinking agents; reinforcing materials such as other fillers; nucleating agents; coupling agents; silane coupling agents; lubricants; waxes; plasticizers; releasing agents; impact modifiers; hue modifiers; flow modifiers; colorants such as dyestuffs and pigments; dispersing agents; antifoaming agents; defoaming agents; antimicrobial agents; antiseptic agents; viscosity modifiers; and thickeners. Each of different additives may be used alone or in combination.

Curable resin compositions according to embodiments of the present invention may be obtained by stirring and mixing the respective components with one another typically at room temperature. The curable resin compositions according to the present invention also include multi-part compositions. The curable resin compositions may be one-part compositions, or be stored as two-part or multi-part compositions and mixed before use.

[Sealant]

A sealant according to an embodiment of the present invention includes the curable resin composition. The sealant according to the present invention excels in properties such as resistance to elevated temperatures, flexibility, transparency, resistance to thermal yellowing, and resistance to photoyellowing and is advantageously usable as sealants typically for optical semiconductor elements.

[Cured Article]

The curable resin composition according to the present invention can be cured through a hydrosilylation reaction using the hydrosilylation catalyst. The hydrosilylation reaction can be performed under conditions not limited, may be performed under known conditions using the catalyst, but is preferably performed at a temperature of 0° C. to 150° C. [preferably room temperature (25° C.) to 120° C.] for about 5 to about 120 minutes, from the viewpoint of reaction rate. The resulting cured article excels in properties such as resistance to elevated temperatures, flexibility, transparency, resistance to thermal yellowing, and resistance to photoyellowing.

EXAMPLES

The present invention will be illustrated in further detail with reference to several working examples below. It should be noted, however, that these examples are never construed to limit the scope of the invention. $^1$H-NMR analyses were performed with JEOL ECA500 (500 MHz).

Synthesis Example 1

Synthesis of Ladder-Type Vinylphenylmethylsilsesquioxane

In a 300-ml four-necked flask were placed 10 g of a ladder-type ethoxy-terminated phenylmethylsilsesquioxane, 3.0 g of a 10 percent by weight tetramethylammonium hydroxide, 200 g of methyl isobutyl ketone, and 5.5 g of dimethylethoxyvinylsilane. The ladder-type ethoxy-terminated phenylmethylsilsesquioxane had a weight-average molecular weight Mw of 2200, an ethoxy group content of 1.5 percent by weight on average per one molecule, and a ratio (molar ratio) of phenyl to methyl of 1:1. The resulting mixture was heated at 45° C. for one hour to complete a reaction. After adding 100 g of ethyl acetate, the reaction mixture was washed with 500 g of water five times. An upper layer after washing was concentrated on an evaporator and evacuated for 30 minutes using a vacuum pump. A liquid ladder-type vinyl-phenylmethylsilsesquioxane [a compound corresponding to the ladder-type silsesquioxane (A) for use in the present invention] was obtained in an amount of 7.8 g. This compound had a weight-average molecular weight Mw of 1700 and a vinyl group content of 5.6 percent by weight on average per one molecule.

[$^1$H-NMR Spectrum of Ladder-Type Vinylphenylmethylsilsesquioxane]

$^1$H-NMR (CDCl$_3$) δ: 0.1 (br), 5.4-6.2 (br), 6.8-7.8 (br)

The ladder-type ethoxy-terminated phenylmethylsilsesquioxane used as a starting material had been prepared by subjecting triethoxymethylsilane and triethoxyphenylsilane (in a molar ratio of 1:1) to hydrolytic condensation according to a common procedure.

Synthesis Example 2

Synthesis of Ladder-Type H-Phenylmethylsilsesquioxane

In a 300-ml four-necked flask were placed 10 g of a ladder-type ethoxy-terminated phenylmethylsilsesquioxane, 6.0 g of a 1.3 percent by weight hydrochloric acid, 40 g of toluene, 20 g of isopropyl alcohol, and 10 g of dimethylethoxysilane. The ladder-type ethoxy-terminated phenylmethylsilsesquioxane had a weight-average molecular weight Mw of 2200, an ethoxy group content of 1.5 percent by weight on average per one molecule, and a ratio (molar ratio) of phenyl to methyl of 1:1. The resulting mixture was stirred at room temperature for 3 hours to complete a reaction. A reaction product was concentrated on an evaporator and thereby yielded a solid ladder-type H-phenylmethylsilsesquioxane [a compound corresponding to the ladder-type silsesquioxane (B) for use in the present invention] in an amount of 8.2 g. This compound had a weight-average molecular weight Mw of 2300 and a content of Si—H bonds of 0.16 percent by weight on average per one molecule.

[$^1$H-NMR Spectrum of Ladder-Type H-Phenylmethylsilsesquioxane]

$^1$H-NMR (CDCl$_3$) δ: 0.1 (br), 4.2-4.4 (br), 6.8-7.8 (br)

Example 1

In a 6-mL screw-capped vial were weighed 0.200 g of the ladder-type vinyl-phenylmethylsilsesquioxane obtained in Synthesis Example 1 and 0.124 g of the ladder-type H-phenylmethylsilsesquioxane obtained in Synthesis Example 2, followed by stirring at room temperature for 2 hours to give a homogeneous solution. The resulting solution was combined with 0.4 μL of platinum-vinylmethylsiloxane complex, followed by stirring again. The resulting mixture was applied to a glass plate, heated on a hot plate at 60° C. for 10 minutes, and thereby yielded a colorless, transparent cured article. The cured article was heated in an oven at 180° C. for 168 hours and was found to suffer from no change in color.

INDUSTRIAL APPLICABILITY

The curable resin composition according to the present invention, when thermally cured, undergoes a hydrosilylation reaction and thereby gives a cured article having satisfactory transparency, excellent resistance to thermal yellowing at elevated temperatures, and superior flexibility. The cured article does not suffer from yellowing even when exposed to elevated temperatures over a long duration, is highly flexible to be resistant to cracking and fracture, and is therefore useful as sealants for next-generation light sources.

The invention claimed is:

1. A curable resin composition comprising a ladder-like silsesquioxane (A) having an aliphatic carbon-carbon double bond in a molecule; a ladder-like silsesquioxane (B) having a Si—H bond in a molecule; and a hydrosilylation catalyst;
wherein the ladder-like silsesquioxane (A) is represented by Formula (L):

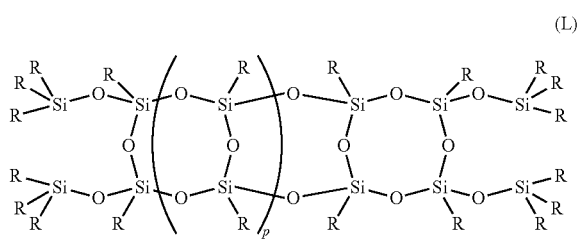

(L)

wherein in Formula (L), p represents an integer of 1 or more, at least one of terminal Rs and/or at least one of Rs as side chains is a group having an aliphatic carbon-carbon double bond, and the remaining Rs other than the group having an aliphatic carbon-carbon double bond are the same as or different from one another and are selected from the group consisting of $C_{1-20}$ alkyl groups and $C_{6-14}$ aryl groups; or
wherein the ladder-like silsesquioxane (B) is represented by Formula (L):

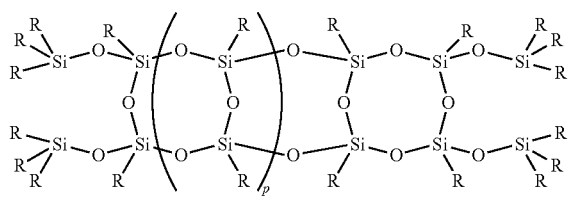

(L)

wherein in Formula (L), p represents an integer of 1 or more, at least one of terminal Rs and/or at least one of Rs as side chains is hydrogen atom or a group having a Si—H bond, and the remaining Rs other than hydrogen atom or a group having a Si—H bond are the same as or different from one another and are at least one selected from the group consisting of $C_{1-20}$ alkyl groups and $C_{6-14}$ aryl groups.

2. A sealant comprising the curable resin composition of claim 1.

3. A cured article obtained by curing the curable resin composition of claim 1.

4. A cured article obtained by curing the curable resin composition of claim 3, wherein said article is heated in an oven at 180° C. for 168 hours and has no change in color.

5. The curable resin composition of claim 1, wherein the ladder-like silsesquioxane (A) having an aliphatic carbon-carbon double bond in a molecule prepared by allowing a ladder-like silsesquioxane having at least one hydrolyzable group or hydroxyl group as R at a terminus to react with at least one silane compound (C) represented by the following Formula (4):

(4)

wherein Formula (4), three R's are the same as or different from one another, but at least one of R's is a group having an aliphatic carbon-carbon double bond, and the remaining R's other than the group having the aliphatic carbon-carbon double bond are the same as or different from each other and are an alkyl group having 1 to 10 carbon atoms, an aryl group having 6 to 10 carbon atoms, or an aralkyl group having 7 to 10 carbon atoms, each of which is substituted or unsubstituted; and X represents a hydrolyzable group or hydroxyl group.

6. The curable resin composition of claim 1, wherein the ladder-like silsesquioxane (B) having a Si—H bond in a molecule prepared by allowing a ladder-like silsesquioxane having at least one hydrolyzable group or hydroxyl group as R at a terminus to react with at least one silane compound (D) represented by following Formula (5):

(5)

wherein in Formula (5), three R's are the same as or different from one another, but at least one of R's is a hydrogen atom, and the remaining R's other than hydrogen atom are the same as or different from each other and are an alkyl group having 1 to 10 carbon atoms, an aryl group having 6 to 10 carbon atoms, or an aralkyl group having 7 to 10 carbon atoms, each of which are substituted or unsubstituted; and X represents a hydrolysable group or hydroxyl group.

7. The curable resin composition of claim 1, wherein the ladder-like silsesquioxane (A) having an aliphatic carbon-carbon double bond in a molecule is a liquid.

8. The curable resin composition of claim 1, wherein the ladder-like silsesquioxane (A) having an aliphatic carbon-carbon double bond in a molecule has a molecular weight of 100 to 4000, and the ladder-like silsesquioxane (B) having a Si—H bond in a molecule has a molecular weight of 100 to 4000.

9. The curable resin composition of claim 1, wherein the ladder-like silsesquioxane (A) having an aliphatic carbon-carbon double bond in a molecule is a ladder-like vinylphenylmethylsilsesquioxane, and the ladder-like silsesquioxane (B) having a Si—H bond in a molecule is a ladder-like H-phenylmethylsilsesquioxane.

10. The curable resin composition of claim 1, wherein the ladder-like silsesquioxane (A) having an aliphatic carbon-carbon double bond in the molecule and the ladder-like silsesquioxane (B) having a Si—H bond in the molecule is present in a total amount of 90 percent by weight or more, based on the total amount of polysiloxanes contained in the curable resin composition.

* * * * *